(12) United States Patent
Joo

(10) Patent No.: US 9,025,227 B2
(45) Date of Patent: *May 5, 2015

(54) SOLAR LIGHT CONCENTRATION PLATE

(75) Inventor: Won-Jae Joo, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 259 days.

This patent is subject to a terminal disclaimer.

(21) Appl. No.: 13/182,897

(22) Filed: Jul. 14, 2011

(65) Prior Publication Data
US 2012/0147443 A1 Jun. 14, 2012

(30) Foreign Application Priority Data

Dec. 8, 2010 (KR) .................. 10-2010-0124955

(51) Int. Cl.
| | | |
|---|---|---|
| *G03H 1/00* | (2006.01) | |
| *G02B 5/32* | (2006.01) | |
| *H01L 31/054* | (2014.01) | |
| *F24J 2/06* | (2006.01) | |
| *F21V 8/00* | (2006.01) | |

(52) U.S. Cl.
CPC .... *G02B 5/32* (2013.01); *F24J 2/06* (2013.01); *G02B 6/0076* (2013.01); *Y02B 10/12* (2013.01); *Y02B 10/20* (2013.01); *Y02E 10/52* (2013.01); *H01L 31/054* (2013.01); *H01L 31/0549* (2013.01); *Y10S 385/90* (2013.01)

(58) Field of Classification Search
USPC .......... 136/246, 259; 126/624, 627, 683–701; 385/37, 129–132, 146; 359/15, 19, 34
See application file for complete search history.

(56) References Cited

U.S. PATENT DOCUMENTS

| | | | | |
|---|---|---|---|---|
| 5,725,970 | A | * | 3/1998 | Martin et al. ............ 430/2 |
| 5,877,874 | A | * | 3/1999 | Rosenberg ............ 359/15 |
| 6,169,614 | B1 | | 1/2001 | Whitcomb et al. |
| 2006/0176533 | A1 | | 8/2006 | Sekine et al. |
| 2007/0023079 | A1 | * | 2/2007 | Mills et al. ............ 136/246 |
| 2008/0049450 | A1 | | 2/2008 | Sampsell |
| 2009/0199893 | A1 | | 8/2009 | Bita et al. |
| 2010/0133422 | A1 | * | 6/2010 | Lin et al. ............ 250/227.11 |
| 2010/0186818 | A1 | | 7/2010 | Okorogu et al. |

FOREIGN PATENT DOCUMENTS

| | | |
|---|---|---|
| KR | 1020090047548 | 5/2009 |
| WO | 2009102671 | 8/2009 |

\* cited by examiner

*Primary Examiner* — Stephone B Allen
*Assistant Examiner* — Kimberly N Kakalec
(74) *Attorney, Agent, or Firm* — Cantor Colburn LLP

(57) ABSTRACT

A solar light concentration plate comprises a plurality of holograms diffracting incident light wherein each of the plurality of the holograms has a thickness, at least one intermediate light guide plate disposed between the plurality of the holograms, and a pair of external light guide plates disposed on outer surfaces of outermost holograms of the plurality of the holograms, wherein at least one of the pair of the external light guide plates has an inner surface and an outer surface inclined relative to the inner surface.

20 Claims, 15 Drawing Sheets

SOLAR LIGHT CONCENTRATION PLATE

CROSS-REFERENCE TO RELATED APPLICATIONS

This application claims priority to Korean Patent Application No. 10-2010-0124955, filed on Dec. 8, 2010, and all the benefits accruing therefrom under 35 U.S.C. §119, the content of which in its entirety is herein incorporated by reference.

BACKGROUND

1) Field

Provided is a solar light concentration plate with high concentration efficiency and wavelength separation.

2) Description of the Related Art

A main energy source that is currently used is a fossil fuel such as coal and petroleum. However, continued use of the fossil fuel causes problems such as global warming and environmental pollution as well as resource exhaustion. Accordingly, use of renewable energy sources that do not cause environmental pollution such as solar light, tidal power, wind power, and geothermal heat has been suggested as an alternative energy source for replacing the fossil fuel.

Among the renewable energy sources, technology of converting the solar light into electricity is most widely used. Various materials and devices are being developed for the efficient conversion of the solar light into electricity, and for example, recently suggested technology based on the multi-layered p-n junction structure and III-V Group materials accomplishes light conversion efficiency of about 40%.

Furthermore, the solar light can be directly used instead of being converted into electricity. For example, direct use of the solar light as an indoor illumination by collecting the solar light by a light-collecting device installed on a rooftop of a building and transmitting the solar light inside the building using light guide has been suggested. The direct use of the solar light transmitted from the rooftop as an indoor illumination may greatly reduce electricity consumption. However, in general, natural lighting is insufficient to be used inside the building and thus artificial illuminations are used even in the daytime.

Therefore, efficient light concentration is the core technology that can be applied to various fields that utilize the solar light. A currently-available light concentration plate usually includes large number of silicon photoelectric conversion devices, thereby having a large area which may not be suitable for a mass production due to high cost.

Therefore, it has been suggested that an optical device such as lens is used for focusing the solar light on a photoelectric conversion device to increase an amount of light in a given area and to reduce a size of a photoelectric conversion device, and a prism or a diffraction lattice is used for separating wavelengths so as to utilize a photoelectric conversion device suitable for each wavelength.

However, the above-described technology may increase a space of the light concentration plate in a direction toward the solar light. For a concentration system using a lens or a hyperbolic mirror, a photoelectric conversion device is spaced apart from the lens or the mirror by a focal distance, and thus an additional space for the focal distance may be required by the system. In the case of a prism, a distance for spatially separating light according to wavelengths may be required. The above mentioned spatial limitations may make it hard to implement a photovoltaic power generation system.

SUMMARY

One embodiment of the present invention provides a solar light concentration plate that occupies a small space, is inexpensive, has high concentration efficiency, and may separate wavelengths.

In an embodiment of the present invention, a solar light concentration plate is provided that includes a plurality of holograms diffracting incident light and having different thicknesses, at least one intermediate light guide plate disposed between the holograms, and a pair of external light guide plates disposed on outer surface of outermost holograms among the plurality of holograms, wherein at least one of the external light guide plates has an inner surface and an outer surface inclined to the inner surface.

In an embodiment of the present invention, among the holograms, an uppermost hologram may have larger angular selectivity than other holograms.

In an embodiment of the present invention, the hologram may diffract light having a wavelength of a range.

In an embodiment of the present invention, the wavelength of a range may be about 10 nanometers (nm) to about 300 nm.

In an embodiment of the present invention, each of the outer surfaces of both external light guide plates may have an outer surface inclined to an inner surface.

In an embodiment of the present invention, the angle made with the outer surfaces of the external light guide plates may be about 1 degree to about 10 degrees.

In an embodiment of the present invention, the holograms may include phase difference holograms.

In an embodiment of the present invention, the hologram may have a thickness of about 1 micron or more.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

Figure 1:
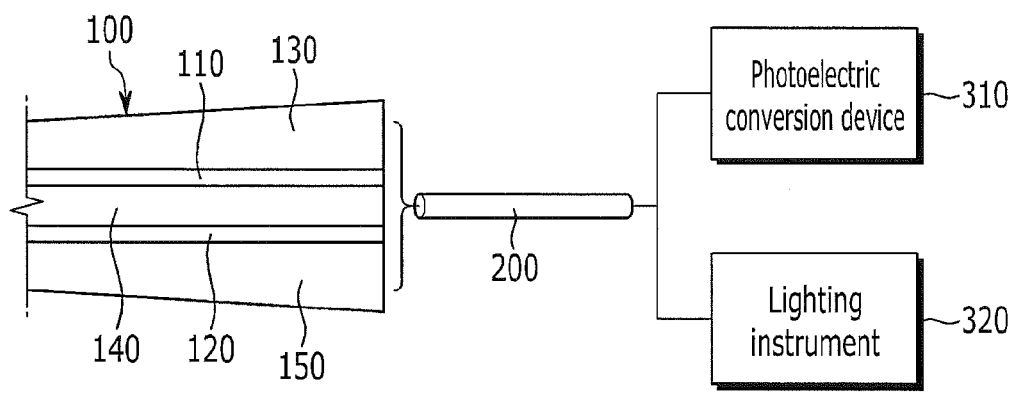
FIGS. 1 and 2 are cross-sectional views of exemplary embodiments of solar light concentration plates.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present invention will be described in further detail with reference to the accompanying drawings.

An exemplary embodiment of a solar light concentration plate is described in detail with reference to FIGS. 1 and 2.

Figure 2:
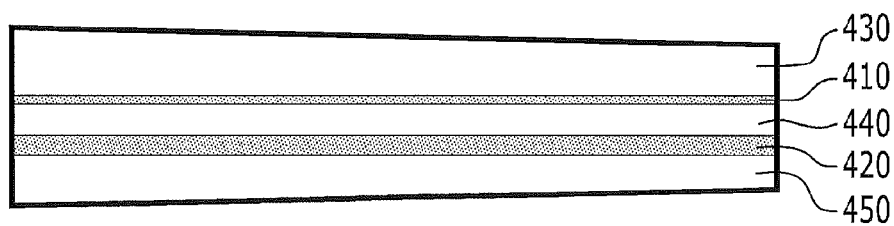

FIGS. 1 and 2 are cross-sectional views of exemplary embodiments of solar light concentration plates.

First, a solar light concentration plate 100 shown in FIG. 1 includes two volume phase holograms 110 and 120, and three light guide plates 130, 140, and 150. The concentration plate 100 may have various shapes such as a triangle, a quadrangle, an oval, for example.

Each of upper, middle, and lower light guide plates 130, 140, and 150 may include a transparent plastic film, for example. In one exemplary embodiment, the plastic film may have a refractive index of about 1.5, and in the present exemplary embodiment, a total reflection angle for light toward air from the light guide plates 130, 140, and 150 is about 42 degrees. In general, a refractive index of a plastic light guide plate is within a range of about 1.3 to about 1.7, and a total reflection angle is determined in the range of about 50 degrees to about 36 degrees according to Snell's law. However, a material included in the light guide plates 130, 140, and 150 is not limited there to as long as the material may guide light.

Although both sides of the middle light guide plate 140, i.e., one side of the middle light guide plate 140 which contacts 110 and the other side of the middle light guide plate 140 which contacts 120 are substantially parallel to each other, the upper and the lower light guide plates 130 and 150, respectively, are substantially sloped such that outer surfaces of the upper and the lower light guide plates 130 and 150 are inclined relative to inner surfaces of the upper and the lower light guide plates 130 and 150. Specifically, the outer surface (or upper surface) and the inner surface (or lower surface) of the upper light guide plate 130 are inclined to each other, and the outer surface (or lower surface) and the inner surface (or upper surface) of the lower light guide plate 150 are also inclined to each other. In one exemplary embodiment, only one of the upper and the lower light guide plates 130 and 150 is substantially sloped such that one of the outer surfaces of the upper and the lower light guide plates 130 and 150 is inclined relative to inner surfaces of the upper and the lower light guide plates 130 and 150. An angle between the outer surface of the upper light guide plate 130 and the outer surface of the lower light guide plate 150 may be greater than about 0 degree and equal to or less than about 10 degrees, and in one preferred exemplary embodiment, the angle between the outer surface of the upper light guide plate 130 and the outer surface of the lower light guide plate 150 may be about 1 degree to about 5 degrees.

The volume phase holograms 110 and 120 include an upper hologram 110 disposed between the light guide plates 130 and 140, and a lower hologram 120 disposed between the light guide plates 140 and 150. Each of the volume phase hologram 110 and 120 diffracts incident light having a wavelength of a determined range which enters at an incidence angle of a determined range, at an angle of a determined range. The two holograms 110 and 120 may have wavelength selectivity of about 10 nanometers (nm) to about 300 nm as a whole range, and may diffract incident light with an incidence angle of about 0 degree to about 10 degrees at any diffraction angle. In one exemplary embodiment, the volume phase holograms 110 and 120 may include a diffraction lattice, and may be recorded using interference of light such as laser, for example. According to the present exemplary embodiment, the volume phase holograms 110 and 120 may be recorded with laser, and the incident light is solar light when using the light guide plate.

In one exemplary embodiment, the holograms 110 and 120, and the light guide plates 130, 140, and 150 may be attached with an index matching adhesive to prevent scattering at the interface therebetween.

The concentration plate 100 may be connected to an optical fiber 200, which may be connected to a photoelectric conversion device 310 and/or a lighting instrument 320. The concentration plate 100 collects incident solar light and sends it to the photoelectric conversion device 310 or the lighting instrument 320 through the optical fiber 200, and the light may be converted into electricity by the photoelectric conversion device 310 or directly used as a direct lighting by the lighting instrument 320.

In one exemplary embodiment, the concentration plate 100 may be directly connected to the photoelectric conversion device 310.

Referring to FIG. 2, a solar light concentration plate 400, similarly to that the exemplary embodiment of the concentration plate 100 shown in FIG. 1, includes three light guide plates 430, 440, and 450, and two volume phase holograms 410 and 420 disposed therebetween.

However, differently from the exemplary embodiment of FIG. 1, the upper and the lower volume phase holograms 410 and 420 have different thicknesses from each other. In FIG. 2, a thicker left portion of the solar light concentration plate 400 is connected to an optical fiber (not shown).

Hereinafter, operating principles of exemplary embodiments of the solar light concentration plates are described in detail.

First, the operating principle of an exemplary embodiment of a volume phase hologram is described in detail with reference to FIGS. 3 to 7.

Figure 3:
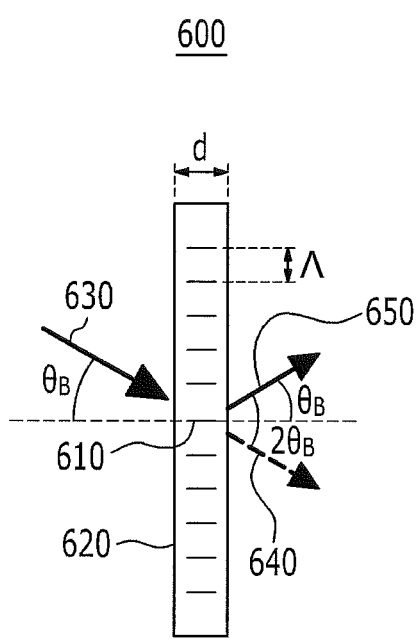
FIGS. 3 and 4 are schematic diagrams respectively explaining Bragg diffraction and Raman-Nath diffraction of an exemplary embodiment of a diffraction lattice.
Figure 4:
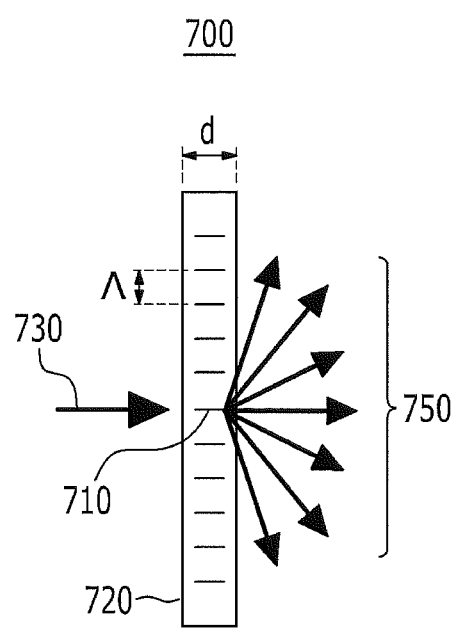
Figure 5:
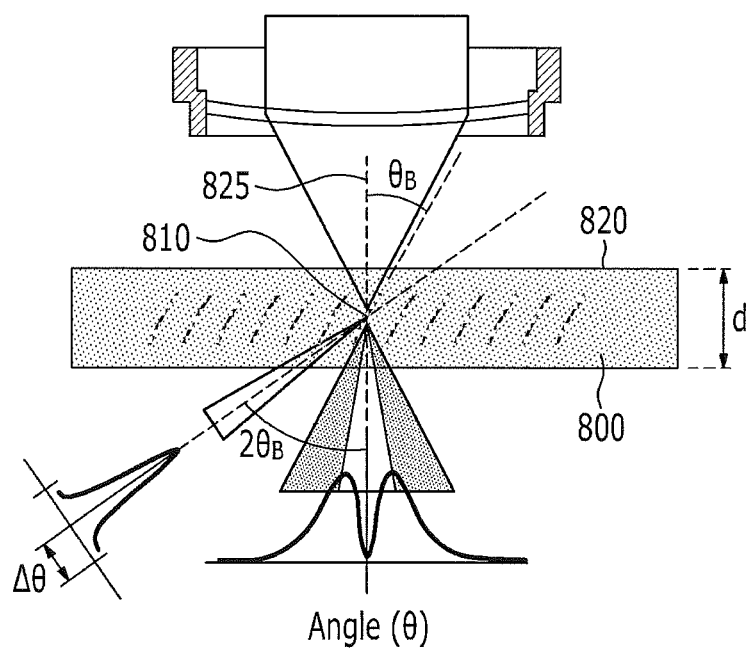
FIGS. 5 and 6 are schematic diagrams respectively explain angular selectivity and wavelength selectivity of an exemplary embodiment a diffraction lattice.
Figure 6:
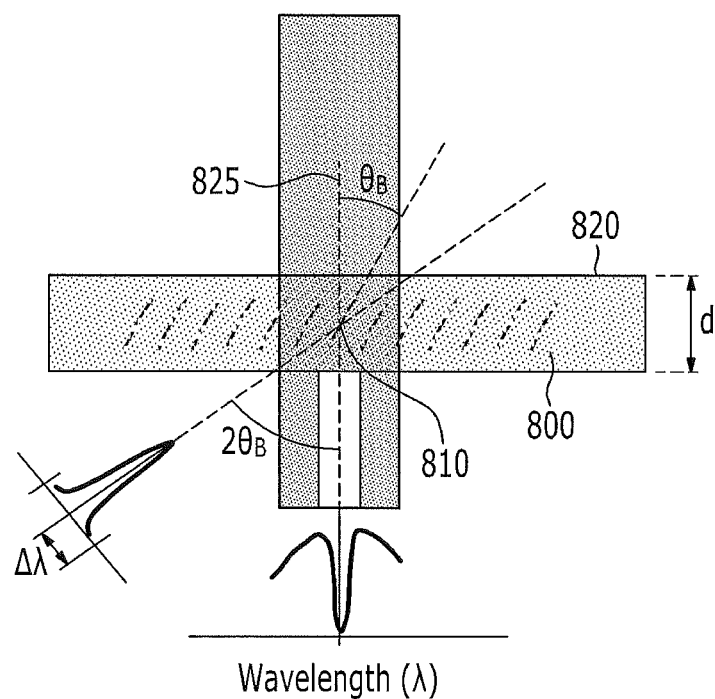
Figure 7:
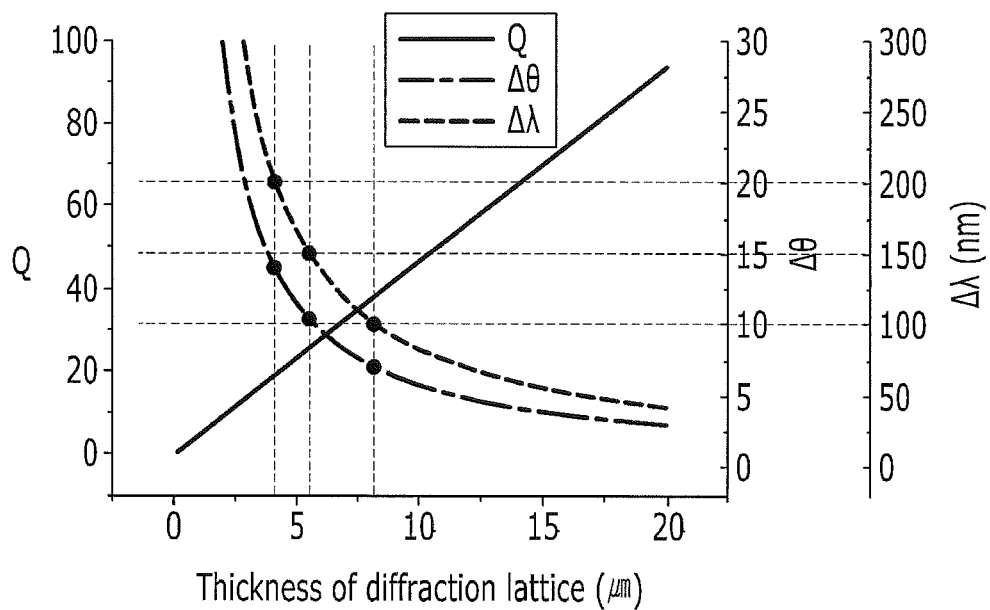
FIG. 7 is a graph showing parameters Q, $\Delta\theta$ and $\Delta\lambda$ as a function of a diffraction lattice thickness, when setting a center wavelength as 500 nanometers (nm) and Bragg angle as 22 degrees.

FIGS. 3 and 4 respectively illustrate Bragg diffraction and Raman-Nath diffraction of an exemplary embodiment of a diffraction lattice, FIGS. 5 and 6 respectively illustrate angular selectivity and wavelength selectivity of the exemplary embodiment of the diffraction lattice, and FIG. 7 is a graph showing parameters Q, Δθ and Δλ as a function of a thickness of the diffraction lattice when setting center a wavelength as 500 nm and Bragg angle as 22 degrees.

FIGS. 3 and 4 show plate-like diffraction lattices 600 and 700, respectively, which are one-dimensional phase holograms. Grating axes 610 and 710 of the diffraction lattices 600 and 700, respectively, are substantially perpendicular to surfaces 620 and 720 of the diffraction lattices 600 and 700, respectively. Two kinds of diffractions are generated by the diffraction lattices 600 and 700. One is Bragg diffraction shown in FIG. 3, which is predominantly generated by a thicker diffraction lattice 600, and the other is Raman-Nath diffraction shown in FIG. 4, which is predominantly generated by a thinner diffraction lattice 700.

Referring to FIG. 3, Bragg diffraction allows incident light 630 which enters only at a given incident angle called Bragg angle ($\theta_B$) relative to the grating axis 610 to be diffracted, and only one outgoing light 650 is admitted. The outgoing light 650 complies with a law of diffraction to make an angle substantially equal to Bragg angle ($\theta_B$) relative to the grating axis 610. Thus, an angle between an extension 640 of the incident light 630 and the outgoing light 650 becomes twice the Bragg angle ($2\theta_B$).

Referring to FIG. 4, according to Raman-Nath diffraction, a specific incidence angle is not required to generate diffraction, and a plurality of diffracted outgoing lights 750 is generated from one incident light 730.

To distinguish a type of diffraction performed by a diffraction lattice, a parameter Q is introduced. The parameter Q is defined by the following equation 1;

$$Q = \frac{2\pi\lambda d}{\Lambda^2 n_0}, \qquad \langle\text{Equation 1}\rangle$$

wherein $\lambda$ is a wavelength, d is the thickness of a diffraction lattice, $\Lambda$ is a pitch distance of a refractive index (or absorption) modulation, and $n_0$ is average refractive index. Generally, a diffraction lattice with Q value equal to or greater than 10 shows Bragg diffraction, and a diffraction lattice with Q value of significantly less than 1 shows Raman-Nath diffraction.

To easily control diffracted light, in the present exemplary embodiment, a Bragg diffraction lattice which has angular selectivity and wavelength selectivity may be used. The characteristics will be described in detail with reference to FIGS. 5 and 6.

FIGS. 5 and 6 show a diffraction lattice 800 wherein a grating axis 810 is inclined at a Bragg angle ($\theta_B$) relative to a surface normal 825 of a surface 820. FIG. 5 shows incident light entering at various incidence angles, and FIG. 6 shows incident light of various wavelengths.

Referring to FIG. 5, angular selectivity refers to a characteristic that diffraction is generated only for an incidence angle of a specific range around Bragg angle ($\theta_B$), wherein a minimum deviation angle at which diffraction is not generated or a maximum angle range ($\Delta\theta$) where diffraction may be generated is defined by the following equation 2;

$$\Delta\theta = \frac{n\lambda}{2d\sin\theta_B}, \qquad \langle\text{Equation 2}\rangle$$

wherein $\lambda$ is a wavelength, d is the thickness of a diffraction lattice 800, and $\theta_B$ is Bragg angle. Angular selectivity ($\Delta\theta$) can be varied from about 0.001 degrees to about 10 degrees. However, it is noted that substantially too large an angular selectivity (Δθ) may make the thickness of a diffraction lattice 800 small, thereby making Q value substantially too small to enter into a Raman-Nath diffraction region.

Referring to FIG. 6, wavelength selectivity refers to a characteristic that diffraction occurs only for a specific wavelength range, wherein the wavelength range (Δθ) that can be diffracted is defined by the following equation 3;

$$\Delta\lambda = \frac{\lambda^2 \cos\theta_B}{2d\sin^2\theta_B},$$ ⟨Equation 3⟩ wherein λ is a wavelength, d is the thickness of a diffraction lattice 600, and $\theta_B$ is a Bragg angle.

As shown in the above-described equations 2 and 3, the angular selectivity and wavelength selectivity depend on the wavelength (λ), the thickness (d) of a diffraction lattice 800, and a Bragg angle ($\theta_B$). Particularly, as the diffraction lattice 800 becomes thicker, the angular selectivity and wavelength selectivity becomes larger, resulting in smaller Δθ and Δλ.

FIG. 7 is a graph showing the parameters Q, Δθ and Δλ as a function of the thickness of a diffraction lattice, when a center wavelength is equal to 500 nm, and Bragg angle is equal to 22 degrees.

In one exemplary embodiment, when Δλ is 150 nm, for example, a thickness of a diffraction lattice for satisfying it is about 5.5 microns (μm). In the present exemplary embodiment, Δθ is about 11 degrees, and Q is about 25. If Δλ is 100 nm, the thickness of a diffraction lattice is about 8 microns, Δθ is about 7 degrees, and Q is about 20.

An exemplary embodiment of a light-concentration plate includes the above described diffraction lattice or volume phase hologram.

An exemplary embodiment of an exemplary embodiment a solar light concentration is described in detail with reference to FIGS. 8 and 9.

Figure 8:
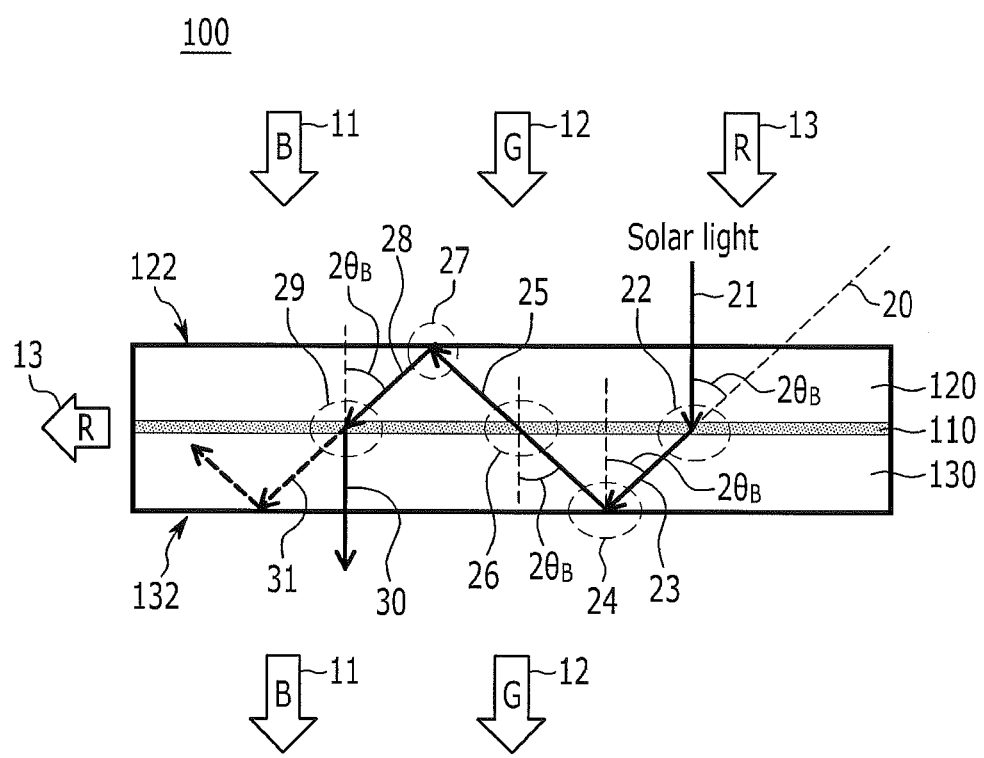
FIGS. 8 and 9 are schematic cross-sectional views explaining operation of the exemplary embodiment of the light concentration plate shown in FIG. 1.
Figure 9:
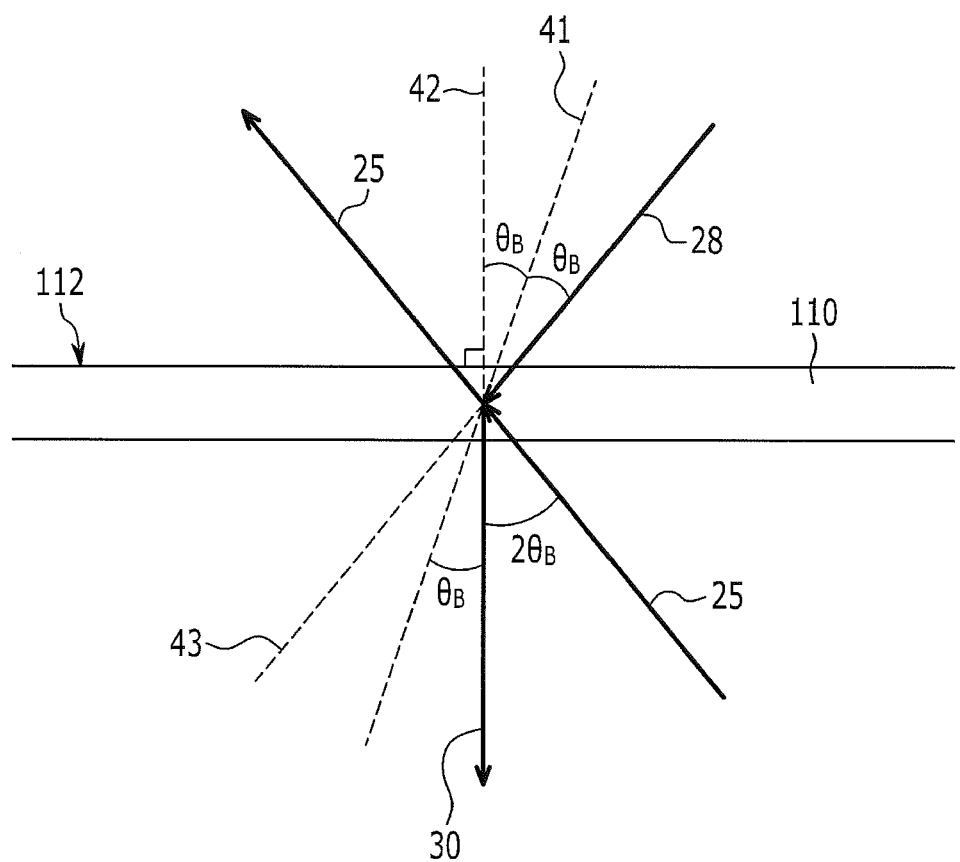

FIGS. 8 and 9 are schematic cross-sectional views of an exemplary embodiment of a solar light concentration plate.

Referring to FIG. 8, Bragg angle of a volume phase hologram 110 is determined larger than ½ of an angle of total reflection of the light guide plates 120 and 130 attached to both sides, i.e., upper side and lower side, of the volume phase hologram 110, and a grating axis of the hologram 110 is made inclined at Bragg angle relative to a surface normal of the hologram 110, as shown in FIGS. 5 and 6. A center wavelength may be selected by controlling a wavelength or incidence angle of recording light of hologram. Specifically, from white solar light, a red wavelength may be exclusively diffracted and other wavelengths may be transmitted. A wavelength range where diffraction can be generated and a minimum deviation angle may be selected by controlling a thickness of hologram. An effective range of the minimum deviation angle will be described below.

Supposing that solar light 21 including blue light 11, green light 12, and red light 13 perpendicularly enters into a concentration plate 100, the incident light 21 passes through the upper light guide plate 120 without changing its angle to reach the hologram 110. The hologram 110 selects red light 13 from the incident light 21 to diffract it at twice the Bragg angle ($2\theta_B$) (22), and passes blue light 11 and green light 12 without changing an incident angle thereof. Since Bragg diffraction has wavelength selectivity, it may diffract only a specific wavelength range. Bragg diffracted light 23 reaches an interface 132 between the lower light guide plate 130 and air, wherein since the incidence angle $2\theta_B$, is larger than the angle of total reflection of the light guide plate 130, the light 23 is totally reflected at the interface 132 (24).

Light 25 totally reflected at the interface 132 between the light guide plate 130 and air meets the hologram 110 again, and passes through the hologram 110 without diffraction (26), which is further described in detail with reference to FIG. 9.

Referring to FIG. 9, when a grating axis 41 is inclined at Bragg angle ($\theta_B$) to a direction 42 perpendicular to a surface 112 of a hologram 110, the incidence angle at which the hologram 110 causes diffraction includes two angles making Bragg angle ($\theta_B$) with reference to the crystal face 41. One of them is a perpendicular direction 42, the other is a direction indicated by a reference numeral 43 (hereinafter also referred to as a "reference direction"). Light entering at an incidence angle other than the perpendicular direction 42 and the reference direction 43 is not diffracted. Therefore, referring to FIG. 7, since the light 25 totally reflected at the interface 132 between the lower light guide plate 130 and air has no relationship with the two directions, it passes through the hologram 110 without diffraction.

The light 25 that passed through the hologram 110 enters into the upper light guide plate 120 and advances to meet an interface 122 between the upper light guide plate 120 and air. Here, since the incidence angle is equal to $2\theta_B$ and larger than an angle of total reflection of the light guide plate 120, the light 25 is also totally reflected at the interface 122 (27). As described above, the perpendicularly incident light 21 entering into the concentration plate 100 begins to be guided toward one direction, i.e., leftward direction, of the concentration plate 100.

However, when light 28 totally reflected at the interface 122 between the upper light guide plate 120 and air meets the hologram 110, diffraction occurs (29) and light may 30 go toward a lower direction, which gets out of the concentration plate 100.

Referring to FIGS. 8 and 9, the direction where the light 28 totally reflected at the interface 122 between the upper light guide plate 120 and air enters the hologram 110 is substantially identical to the reference direction 43. Therefore, the light 28 diffracted by the hologram 110 goes along the perpendicular direction 42 according to the law of reflection. Therefore, the diffracted light 30 goes toward the lower direction 30 to get out of the concentration plate 100.

In order that the light 28 totally reflected at the interface 122 between the upper light guide plate 120 and air does not get out of the concentration plate 100 to be continuously guided, the light 28 may go straight toward the direction indicated by reference numeral 31 without being diffracted by the hologram 110, which will be further described in the following embodiment.

Another exemplary embodiment of a solar light concentration plate is described with reference to FIGS. 10 and 11.

Figure 10:
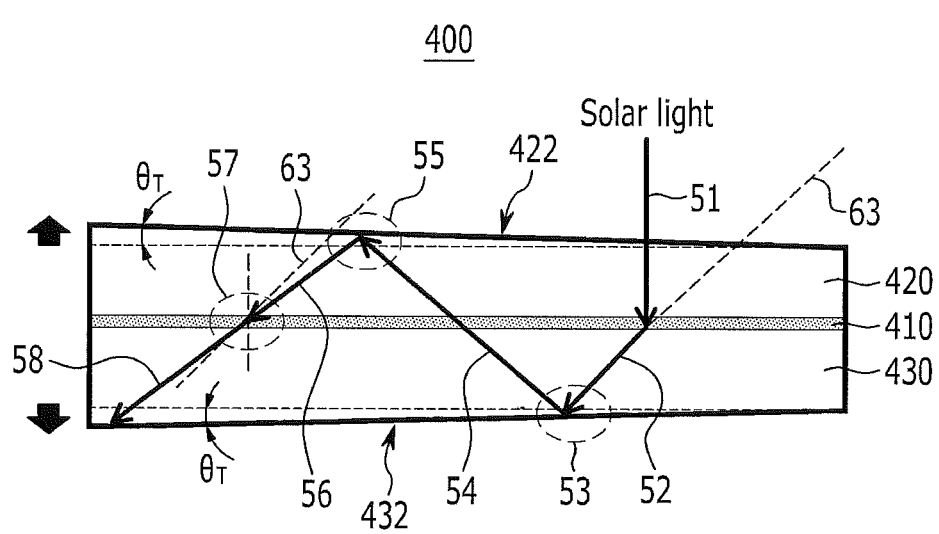
FIGS. 10 and 11 are schematic cross-sectional views explaining operation of the exemplary embodiment of the light concentration plate shown in FIG. 2.
Figure 11:
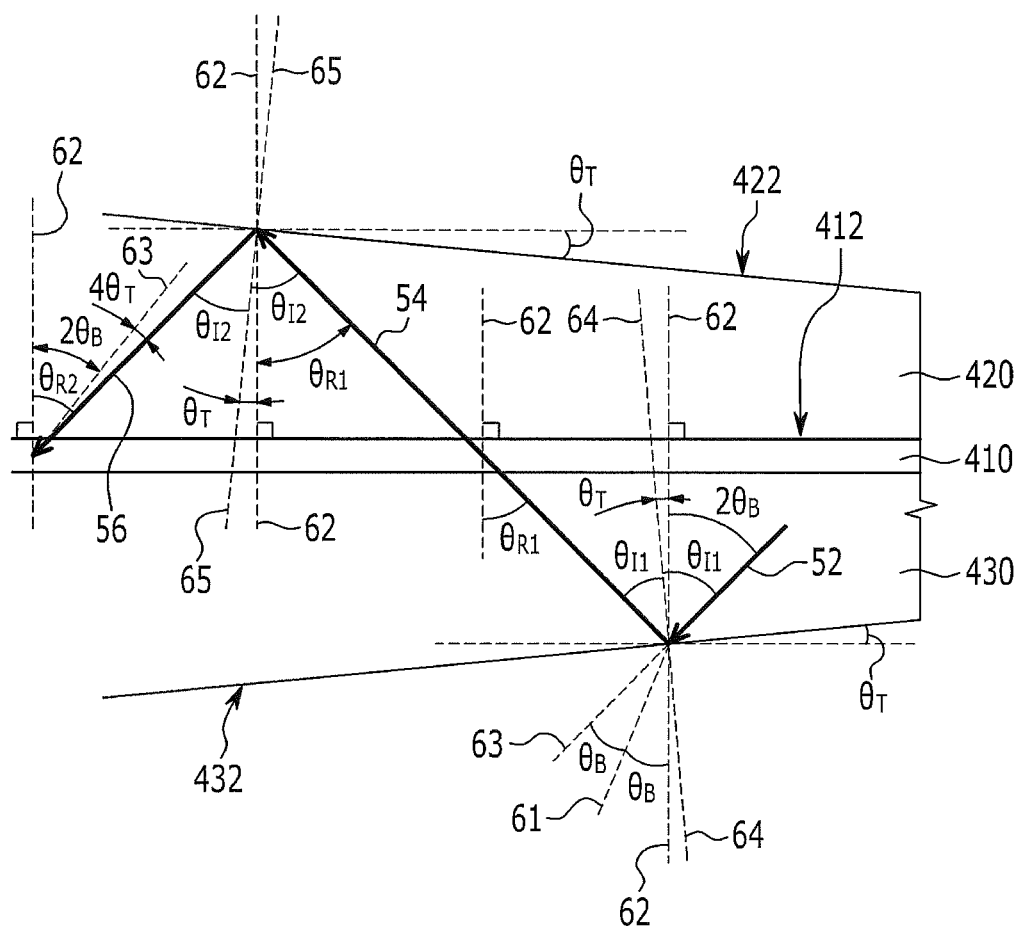

FIGS. 10 and 11 are schematic cross-sectional views of another exemplary embodiment of a solar light concentration plate 400.

Referring to FIG. 10, a tilt angle ($\theta_T$) of upper and lower light guide plates 420 and 430 relative to a horizontal axis, e.g., upper and lower surfaces of a hologram 410 is larger than ¼ of the angular selectivity (Δθ) of the above-described diffraction lattice or hologram 410.

In the present exemplary embodiment, perpendicularly entering incident light 51 passes through the upper light guide plate 420 without significant change in the progressing direction to reach the hologram 410, and it is diffracted to a reference direction 63. Since an upper surface of the upper light guide plate 420 is slightly tilted relative to the horizontal axis, slight refraction may occur when the incident light 51 enters the upper light guide plate 420 from the air, and an incident angle the incident light 51 entering the hologram 410 may be substantially slightly out of the perpendicular direction, but such refraction may be ignored for better comprehension and ease of description because the incident angle the incident light 51 entering the hologram 410 may be corrected when recording the hologram 410 or be within angular selectivity range.

Light 52 diffracted by the hologram 410 passes through the lower light guide plate 430 and totally reflected at an interface 432 between the lower light guide plate and air (53). Totally reflected light 54 passes through the hologram 410 without diffraction, enters the upper light guide plate 420, reaches an interface 422 between the upper light guide plate and air, and is totally reflected at the interface 422 (55). The twice totally reflected light 56 meets the hologram 410 again, and at this time, since the incidence angle of the twice totally reflected light 56 entering the hologram 410 is larger than angular selectivity around the reference direction 63, the light 56 passes through the hologram 410 without diffraction. Finally, the incident light repeats this process and is guided to one end of the concentration plate 400, i.e., leftward direction.

This process is further described in detail with reference to FIG. 11.

Referring to FIG. 11, supposing that a direction perpendicular to the upper surface 412 of the hologram 410 is a perpendicular direction 62 to the hologram 410, the light 52 diffracted by the hologram 410 is in the reference direction 63, an angle between the reference direction 63 and the grating axis 61 of the hologram 410 is $\theta_B$, and an angle between the reference direction 63 and the perpendicular direction 62 is $2\theta_6$, wherein $\theta_B$ is a Bragg angle.

Supposing that a direction perpendicular to the interface 432 between the lower light guide plate 430 and air is a perpendicular direction 64 to the lower light guide plate 430, the perpendicular direction 64 to the lower light guide plate 430 is tilted at an angle ($\theta_T$) to the perpendicular direction 62 to the hologram. The angle $\theta_{i1}$ at which diffracted light 52 enters the interface 432 should be determined with reference to the perpendicular direction 64 to the lower light guide plate 430, as represented by the following equation 4;

$$\theta_{i1}=2\theta_B+\theta_T \qquad \text{<Equation 4>}$$

Light 54 reflected at the interface 432 according to the law of reflection also makes an angle of $\theta_{i1}$ relative to the perpendicular direction 64 perpendicular to the lower light guide plate 430.

An incidence angle $\theta_{R1}$ at which the light 54 reflected at the interface 432 enters the hologram 410 again should be calculated with reference to the perpendicular direction 62 to the hologram instead of the perpendicular direction 64 to the lower light guide plate 430, as represented by the following equation 5;

$$\theta_{R1}=\theta_{i1}+\theta_T=(2\theta_B+\theta_T)+\theta_T=2\theta_B+2\theta_T \qquad \text{<Equation 5>}$$

Since the incidence angle $\theta_{R1}$ is distant from the perpendicular direction 62 and the reference direction 63, the light 54 passes through the hologram 410 without diffraction.

An incidence angle $\theta_{i2}$ at which the light 54 passing through the hologram 410 enters the interface 422 between the upper light guide plate 420 and air should be determined with reference to a perpendicular direction 65 to the upper light guide plate 420 which is perpendicular to the interface 422 between the upper light guide plate 420 and air. And, since the direction 65 perpendicular to the upper surface of the upper light guide plate 420 is tilted at an angle $\theta_T$ with reference to a perpendicular direction 62 to the hologram 410 in the opposite direction to the perpendicular direction 64 to the lower surface of the lower light guide plate, the incidence angle $\theta_{i2}$ is calculated by the following equation 6;

$$\theta_{i2}=\theta_{R1}+\theta_T=(2\theta_B+2\theta_T)+\theta_T=2\theta_B+3\theta_T \qquad \text{<Equation 6>}$$

And, the light 56 reflected by the interface 422 also makes an angle of $\theta_{i2}$ relative to the perpendicular direction 65 to the upper surface of the upper light guide plate 420.

The incidence angle $\theta_{R2}$ at which the light 56 reflected at the interface 422 enters the hologram 410 again is calculated with reference to the perpendicular direction 62 to the hologram, as represented by the following equation 7;

$$\theta_{R2}=\theta_{i2}+\theta_T=(2\theta_B+3\theta_T)+\theta_T=2\theta_B+4\theta_T \qquad \text{<Equation 7>}$$

Therefore, if $4\theta_T$ is lrger than angular selectivity ($\Delta\theta$) of the hologram 410, the light 56 passes through without diffraction by the hologram 410.

In one exemplary embodiment, only one of the two light guide plates 420 and 430 may be inclined using the above principle.

Meanwhile, wavelength selectivity $\Delta\lambda$ of 150 nm means that diffraction efficiency of light deviating 150 nm from the center wavelength becomes 0. Specifically, the entire range including a shorter wavelength range and a longer wavelength range with reference to the center wavelength is 300 nm. However, since substantially effective amount of light is about an half of maximum diffraction efficiency and thus the wavelength range decrease by half, light within about 150 nm range is substantially diffracted and satisfies guide condition. Thus, reference to wavelength selectivity is determined as $\Delta\theta$ of about 11 degrees, and the tilt angle ($\theta_T$) shown in FIG. 10 is about 3 degrees. Supposing that the length of the concentration plate 400 is 300 millimeters (mm), difference between the thicknesses of the thicker part and the thinner part in one light guide plate of 420 and 430, respectively, is about 15 mm, and a thickness difference between a sum of the thicker part of the two concentration plates 420 and 430 and a sum of the thinner part of the two concentration plates 420 and 430 is about 30 mm. Therefore, the concentration plate 400 has a thicker thickness of one side compared to the length or area of the other side.

A thick concentration plate 400 may cause loss when transmitting light from the concentration plate 400 to optical fiber 200, and increase manufacture cost.

The tilt angle ($\theta_T$) should be substantially decreased to reduce the thickness of the concentration plate 400, and angular selectivity of the hologram 410 should be substantially reduced to substantially decrease the tilt angle ($\theta_T$).

The exemplary embodiment shown in FIG. 1 includes a plurality of holograms to reduce angular selectivity.

Then, the operation of the exemplary embodiment of the solar light concentration plate as shown in FIG. 1 is described in detail with reference to FIGS. 12 to 15.

Figure 12:
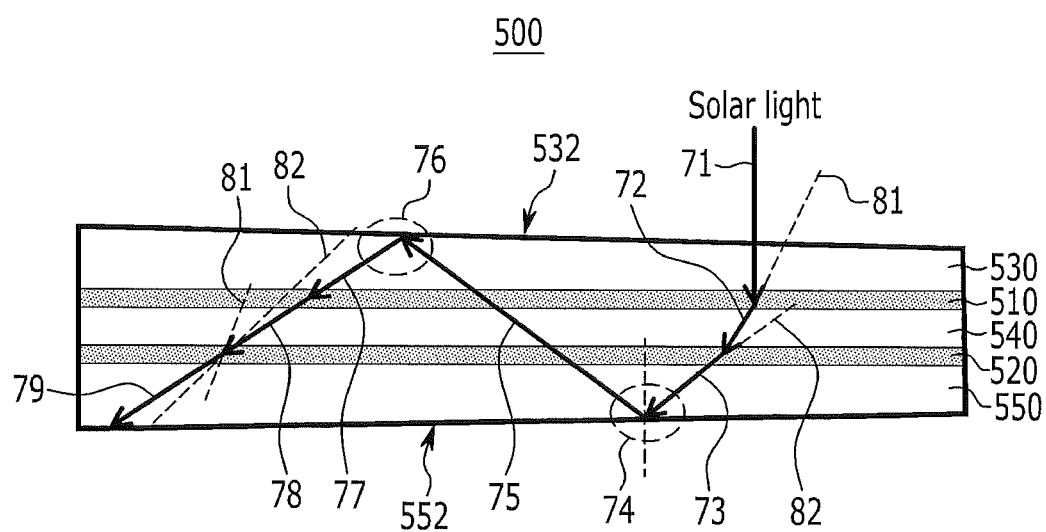
FIG. 12 is a schematic cross-sectional view explaining operation of the exemplary embodiment of the light concentration plate shown in FIG. 1.
Figure 13:
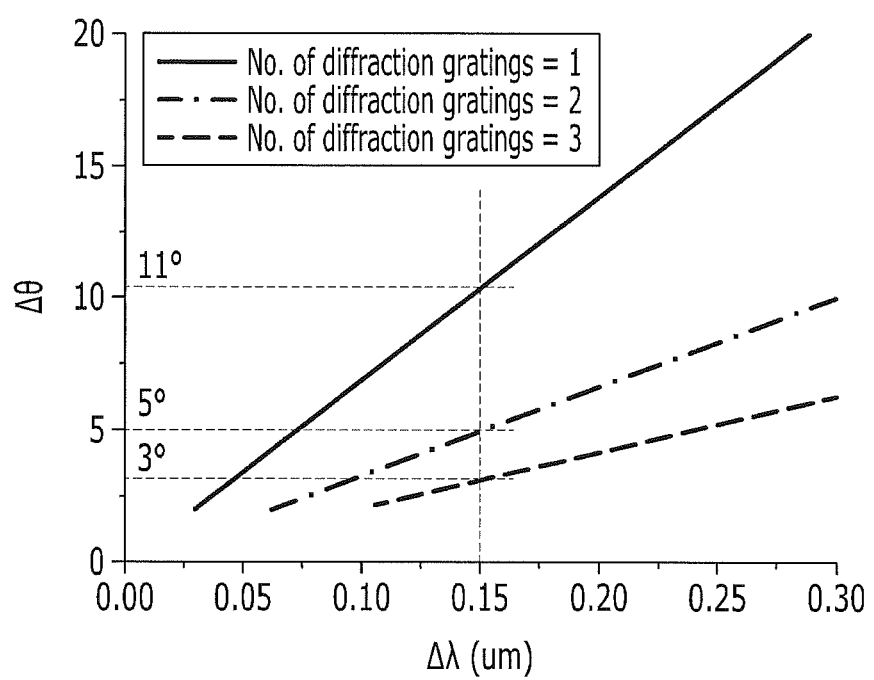
FIG. 13 is a graph showing change in angular selectivity in three cases of diffraction lattices.
Figure 14:
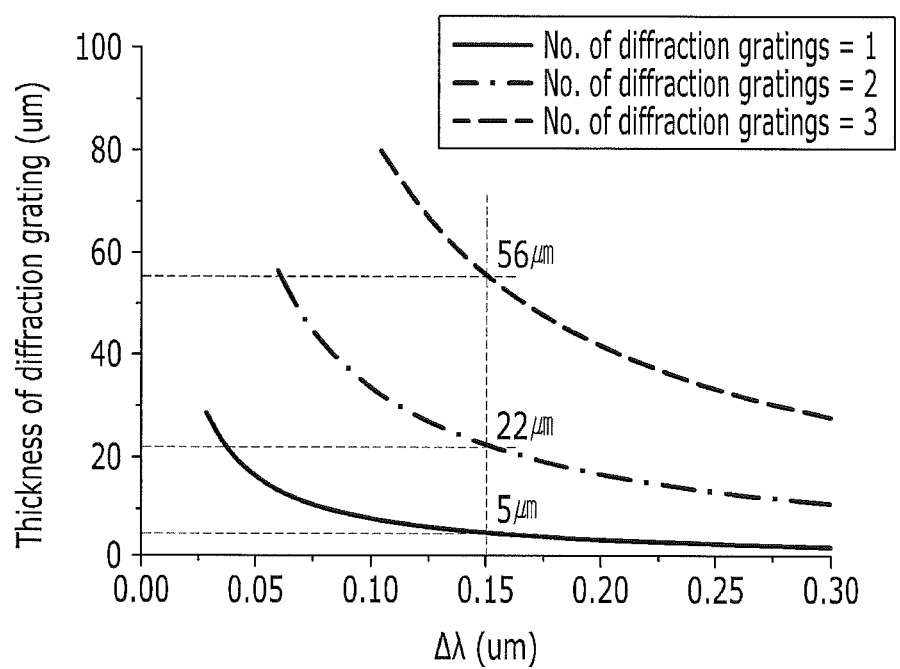
FIG. 14 is a graph showing a thickness of a diffraction lattice satisfying about 150 nm wavelength selectivity and angular selectivity corresponding thereto.
Figure 15:
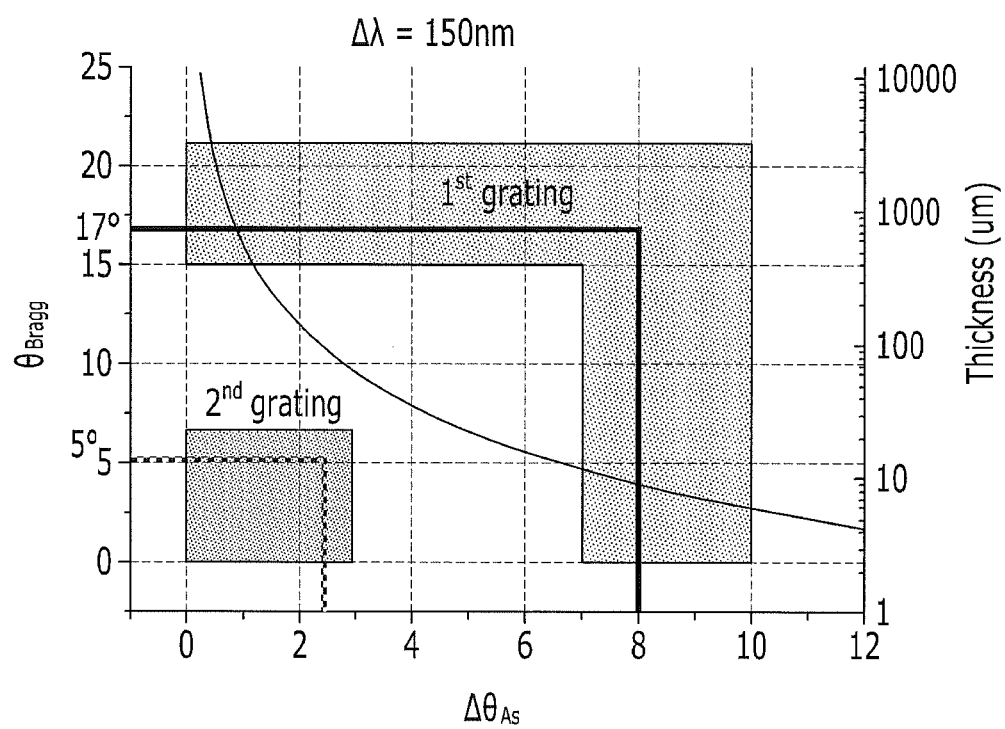
FIG. 15 is a graph showing calculation result for thickness design of upper and lower holograms.

FIG. 12 is a schematic cross-sectional view explaining the operation of the exemplary embodiment of the concentration plate of FIG. 1, FIG. 13 is a graph showing change in angular selectivity of diffraction lattices in cases 1 to 3, FIG. 14 is a graph showing the thickness of a diffraction lattice satisfying about 150 nm wavelength selectivity and corresponding angular selectivity, and FIG. 15 is a graph showing a calculation result for thickness design of upper and lower holograms.

Referring to FIG. 12, since upper and lower volume phase holograms 510 and 520 are disposed between upper, middle and lower light guide plates 530, 540, and 550, perpendicular incident light 71 is primarily diffracted by the upper hologram 510, and primarily diffracted light 72 passes through the middle light guide plate 540, and then, secondarily diffracted again by the lower hologram 520. Since total reflection condition of the light guide plate is satisfied through the secondary diffraction, Bragg angles of the upper and lower holograms may be decreased to reduce a minimum deviation angle. The secondarily diffracted light 73 is totally reflected at an interface 552 between the lower light guide plate 550 and air (74), totally reflected light 75 passes through the two holograms 510 and 520 without diffraction to reach an interface 532 between the upper, light guide plate 530 and air (76). The light 75 is totally reflected at the interface 532 between the upper light guide plate 530 and air, and totally reflected light 77 meets and passes through the upper hologram 510 without diffraction. Light 78 passing through the upper hologram 510 passes through the middle light guide plate 540, and then meets the lower hologram 520, and also passes through it without diffraction. Light 79 passing through the lower hologram 520 is totally reflected at the interface 552 between the lower light guide plate 550 and air again, and progresses to a leftward direction with repeating the above described process In FIG. 12, a diffraction reference direction of the upper hologram 510 is indicated by a reference numeral 81, and a diffraction reference direction of the lower hologram 520 is indicated by a reference numeral 82, wherein Bragg angle of the hologram 520 is smaller than those of the exemplary embodiments shown in FIGS. 11 and 12. If the Bragg angle of a single hologram 410 is 22 degrees, for example, outgoing light of a same angle as the outgoing light of the single hologram 410 may be obtained from the lower hologram 520 by setting each Bragg angle of two holograms 510 and 520 as 11 degrees. However, a direction of the grating axis of the lower hologram 520 is determined so that light entering in a diffraction reference direction 81 of the upper hologram 510 instead of a perpendicular direction is diffracted.

In one exemplary embodiment, a number of holograms may be three or more, and as a number of holograms increases, the Bragg angle of each hologram decreases in proportion to the number of the holograms.

FIG. 13 shows change in angular selectivity of diffraction lattices (or holograms) in cases 1 to 3. As shown in the graph, as a number of diffraction lattices increases, angular selectivity of each diffraction lattice decreases to 11 degrees in case 1, 5 degrees in case 2, and 3 degrees in case 3. If angular selectivity decreases, a tilt angle of a light guide plate may decrease, and thus the thickness of the light guide plate may be reduced or an area of the light guide plate may increase.

If the thickness of the thicker side of the light guide plate is determined as 10 mm, for example, length may increase to 104 mm in a single diffraction lattice structure, 227 mm in a double diffraction lattice structure, and 385 mm in a triple diffraction lattice structure, which means that an area of the concentration plate also increases.

FIG. 14 shows a thickness of a diffraction lattice satisfying about 150 nm wavelength selectivity and corresponding angular selectivity. As a number of diffraction lattices increases, Bragg angle decreases and a thickness of the diffraction lattice increases. Increase in the thickness of the diffraction lattice may result in increase in diffraction efficiency.

So far, exemplary embodiments of a method of efficiently guiding solar light entering in a perpendicular direction to the concentration plate have been described. However, an incidence angle of solar light changes every hour by the rotation of earth and every season due to the revolution of the earth. Therefore, it is important to maintain high efficiency concentration performance during change in the location of the sun. In this regard, angular selectivity ($\Delta\theta$) is a substantially important parameter. If $\Delta\theta$ is substantially large, it may be difficult to avoid diffraction of the light inside the concentration plate by a diffraction lattice, and if $\Delta\theta$ is substantially small, entering solar light may become sensitive to incidence angle and high efficiency concentration may be achieved only at substantially perpendicular angle relative to the concentration plate. Therefore, there is a need to relax solar light incidence conditions while eliminating light loss by interaction between guided light and a diffraction lattice.

Therefore, in one exemplary embodiment, the upper hologram related to incidence condition may be designed to have large $\Delta\theta$, and the lower hologram may be designed to have small $\Delta\theta$. The exemplary embodiment is shown in FIG. 2, wherein the thickness of the upper hologram 410 is smaller than the thickness of the lower hologram 420.

Relationship between angular selectivity and thickness is described in detail with reference to FIG. 15.

FIG. 15 is a graph showing a calculation result for thickness design of the upper and lower holograms 410 and 420, wherein the two holograms 410 and 420 in combination should provide angle displacement of the incident light perpendicularly entering the surface at an angle of total reflection of the light guide plates 430, 440, and 450, for example, 42 degrees or more in the concentration plate. This means that the sum of Bragg angles of the two holograms 410 and 420 should be 21 degrees or more. And, the upper hologram 410 indicated by $1^{st}$ grating in FIG. 15 provides comparatively weak angular selectivity ($\Delta\theta > 7$ degrees), and the lower hologram 420 indicated by $2^{nd}$ grating provides strong angular selectivity ($\Delta\theta < 3$ degrees). If Bragg angle of the upper hologram 410 is 17 degrees and the thickness is 10 microns, for example, relatively gentle incidence condition may be obtained with angular selectivity of 8 degrees. If Bragg angle of the lower hologram 420 is 5 degrees and the thickness is 100 microns, for example, angular selectivity will be 3 degrees, thus eliminating light loss due to rediffraction occurred by guide in the concentration plate.

Figure 16:
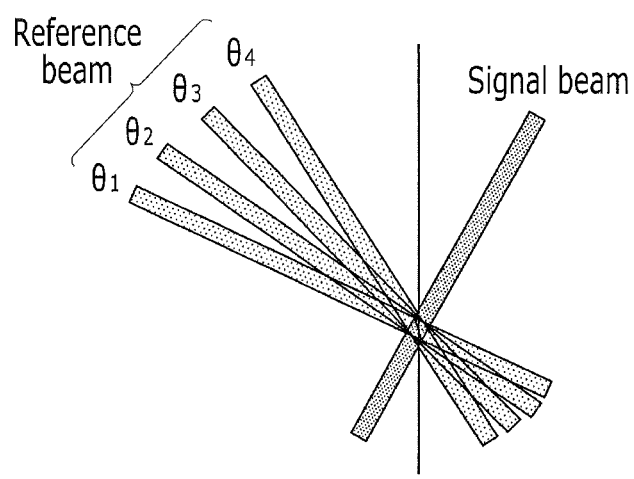
FIGS. 16 and 17 are a schematic diagram and a graph respectively explaining angle multiplexing.
Figure 17:
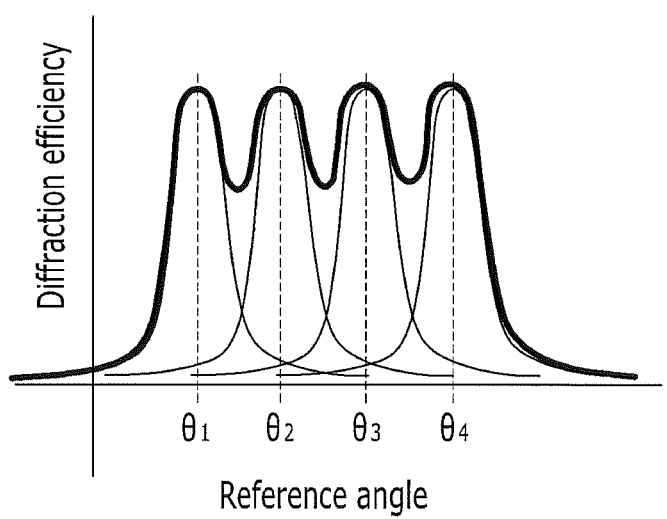

To further relaxing incidence condition, angle multiplexing may be introduced in the upper hologram 410 to form multiple holograms. Referring to FIGS. 16 and 17, to introduce angle multiplexing, incidence angles $\theta_1$ to $\theta_4$ of reference beam is controlled while fixing signal beam when recording hologram. For design and correction of recording time or angle, known method in holographic memory may be used. The multiple holograms recorded by the above method identically diffract light entering in various directions at progress course of the signal beam. The light is diffracted again by the lower hologram 420 beyond the angle of total reflection, and finally guided in the concentration plate 400.

As described above, according to the present exemplary embodiments, high concentration efficiency and wavelength separation may be enabled while using inexpensive and less space occupying light guide plate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar light concentration plate comprising:
   a plurality of holograms diffracting incident light wherein the plurality of the holograms have different thicknesses;

wherein the plurality of the holograms comprises a first hologram and a second hologram, and the second hologram has a larger thickness and smaller wavelength selectively than the first hologram;

at least one intermediate light guide plate disposed between the plurality of the holograms; and a pair of external light guide plates disposed on outer surfaces of outermost holograms of the plurality of the holograms, wherein at least one of the pair of the external light guide plates has an inner surface, and an outer surface inclined relative to the inner surface.

2. The solar light concentration plate of claim 1, wherein an uppermost hologram of the outermost holograms of the plurality of holograms has larger angular selectivity than other holograms of the plurality of holograms.

3. The solar light concentration plate of claim 1, wherein the plurality of holograms diffract light having a wavelength falling within a range of wavelengths.

4. The solar light concentration plate of claim 3, wherein the predetermined range of wavelengths is about 10 nanometers to about 300 nanometers.

5. The solar light concentration plate of claim 1, wherein each of the external light guide plates has the outer surface inclined to the inner surface.

6. The solar light concentration plate of claim 5, wherein an angle made with the outer surfaces of the external light guide plates is about 1 degree to about 10 degrees.

7. The solar light concentration plate of claim 1, wherein the plurality of the holograms comprises phase difference holograms.

8. The solar light concentration plate of claim 7, wherein the thickness of the plurality of the hologram is equal to or greater than about 1 micron.

9. The solar light concentration plate of claim 1, wherein the at least one intermediate light guide plate include a transparent plastic film.

10. The solar light concentration plate of claim 9, wherein the plastic film may have a refractive index of about 1.5.

11. The solar light concentration plate of claim 1, wherein a total reflection angle for light toward air from the at least one intermediate light guide plate is about 42 degrees.

12. The solar light concentration plate of claim 1, wherein the plurality of the holograms and the pair of external light guide plates are attached with an index matching adhesive.

13. The solar light concentration plate of claim 1, wherein the plurality of the holograms is recorded with laser.

14. The solar light concentration plate of claim 1, wherein an optical fiber is connected to a thicker side of the solar light concentration plate.

15. The solar light concentration plate of claim 1, wherein a photoelectric conversion device is connected to a thicker side of the solar light concentration plate.

16. A method of guiding light using a solar light concentration plate, the method comprising;

providing a plurality of holograms diffracting incident light wherein the plurality of the holograms have different thicknesses;

wherein the plurality of the holograms comprises a first hologram and a second hologram, and the second hologram has a larger thickness and smaller wavelength selectively than the first hologram;

disposing at least one intermediate light guide plate between the plurality of the holograms; and disposing a pair of external light guide plates on outer surfaces of outermost holograms of the plurality of the holograms, wherein at least one of the pair of the external light guide plates has an inner surface and an outer surface inclined relative to the inner surface.

17. The method of claim 16, wherein an uppermost hologram of the outermost holograms of the plurality of holograms has larger angular selectivity than other holograms of the plurality of holograms.

18. The method of claim 16, wherein the plurality of holograms diffract light having a wavelength falling within a range of wavelengths.

19. The method of claim 16, wherein the predetermined range of wavelengths is about 10 nanometers to about 300 nanometers.

20. The method of claim 16, wherein each of the external light guide plates has the outer surface inclined to the inner surface.

\* \* \* \* \*